United States Patent [19]

Hascoe

[11] 4,105,861
[45] Aug. 8, 1978

[54] HERMETICALLY SEALED CONTAINER FOR SEMICONDUCTOR AND OTHER ELECTRONIC DEVICES

[75] Inventor: Norman Hascoe, Larchmont, N.Y.

[73] Assignee: Semi-Alloys, Inc., Mount Vernon, N.Y.

[21] Appl. No.: 617,494

[22] Filed: Sep. 29, 1975

[51] Int. Cl.² .............................................. H05K 5/06
[52] U.S. Cl. ................................. 174/52 FP; 357/74
[58] Field of Search ..................... 174/52 FP, 52 PE; 357/74

[56] References Cited

U.S. PATENT DOCUMENTS

| | | | |
|---|---|---|---|
| 3,676,569 | 7/1972 | Thompson | 174/52 FP |
| 3,676,748 | 8/1972 | Kobayashi et al. | 174/57 FP UX |
| 3,684,818 | 8/1972 | Netherwood | 174/52 FP |
| 3,714,370 | 1/1973 | Nixen et al. | 174/52 FP X |
| 3,762,039 | 10/1973 | Douglass et al. | 174/52 FP UX |
| 3,801,728 | 4/1974 | Gallo, Jr. et al. | 174/52 FP |

Primary Examiner—J. V. Truhe
Assistant Examiner—D. A. Tone
Attorney, Agent, or Firm—Laurence B. Dodds

[57] ABSTRACT

An hermetically sealed container for electronic devices comprises a supporting pad for an electronic device, a conductive lead frame surrounding the pad and forming therewith a unitary construction, and a sheet of homogeneous epoxy resin extending over and fused to each face of the frame and its conductive leads, at least one of the sheets having an aperture dimensioned and disposed to surround the supporting pad and a portion of the adjacent leads of the lead frame. The container further comprises upper and lower cover plates of a material of the group comprising metal, ceramic, glass, and rigid plastic fused to the plastic sheets, one of such plates having an opening in registry with the aperture in the adjacent one of the plastic sheets for receiving an electronic device to be supported on the pad. The container further comprises means for hermetically sealing the opening in such one of the cover plates, for example an upset cavity in the plate forming an integral portion thereof.

In an alternative construction, the supporting pad for the electronic device is a portion of the lower cover plate in the form of an upwardly-protruding pedestal and each of the plastic sheets has an aperture dimensioned and disposed to surround such supporting pad and a portion of the adjacent leads of the lead frame, the pedestal extending at least partially through the aperture of the adjacent one of the plastic sheets.

6 Claims, 5 Drawing Figures

HERMETICALLY SEALED CONTAINER FOR SEMICONDUCTOR AND OTHER ELECTRONIC DEVICES

BACKGROUND OF THE INVENTION

This invention relates to a new and improved hermetically sealed container for semiconductor and other electronic devices and particularly to such a container designed and intended hermetically to seal semiconductor integrated circuit devices and the like.

The majority of semiconductor integrated circuit devices are housed in hermetically sealed packages commonly referred to as dual-in-line, flatpack, and hybrid packages. Several designs of such packages are now in use. Among these is one which consists of a ceramic base, a cover, a lead frame, and solder glass for sealing the frame between the base and the cover, known in the trade as the CERDIP package. Another package type consists of a lead frame sandwiched between layers of a glass-ceramic mixture. A cavity is left in one of the layers and the semiconductor device is sealed into the cavity with a metal lid and solder preform. Premolded and transfer-molded plastic packages are also used. One popular type of package is made from a single layer of ceramic having a screened, conductive lead frame pattern deposited on it, the terminal pins on the side of the package being brazed on to give a so-called "side braze" package. This type of package is also made with two layers of ceramic material with the screened conductive pattern sandwiched between the layers and ordinarily sealed with metal lids and metallic solder preforms. A number of packages comprising hybrids of those described above are also in use.

All of the above-described packages are relatively expensive and have certain disadvantages. The CERDIP package requires an excessively high temperature for hermetic sealing. The plastic transfer-molded method of packaging produces low yields because the semiconductor-to-lead-frame bonding wires are fragile and tend to be torn loose during the molding process. The plastic premolded package is relatively expensive and does not have hermetic sealing characteristics. The hybrid packages are subject to the disadvantages of their basic constituents.

It is an object of the present invention to provide a new and useful design for an hermetically sealed semiconductor package which is very low in cost, lends itself extremely well to automatic manufacture, requires relatively low tooling cost, and is a very rugged package having reliable hermetic sealing properties.

SUMMARY OF THE INVENTION

In accordance with the invention, there is provided an hermetically sealed container for electronic devices which comprises a supporting pad for an electronic device, a conductive lead frame surrounding the pad, and a sheet of homogeneous thermosetting plastic material extending over and fused to each face of the lead frame and its conductive leads. At least one of the plastic sheets has an aperture dimensioned and disposed to surround the supporting pad and a portion of the adjacent leads of the lead frame.

The container further comprises upper and lower cover plates of material impervious to moisture and air fused to the plastic sheets, one of such plates having an opening in registry with the aperture in the adjacent one of the plastic sheets for receiving an electronic device to be supported on the pad, and means for hermetically sealing such opening in the one of such plates.

For a better understanding of the present invention, together with other and further objects thereof, reference is had to the following description, taken in connection with the accompanying drawings, while its scope will be pointed out in the appended claims.

BRIEF DESCRIPTION OF THE DRAWINGS

FIG. 3a is a cross-sectional detail of the cover plate of FIG. 3; while

DESCRIPTION OF THE PREFERRED EMBODIMENTS

Figure 1:
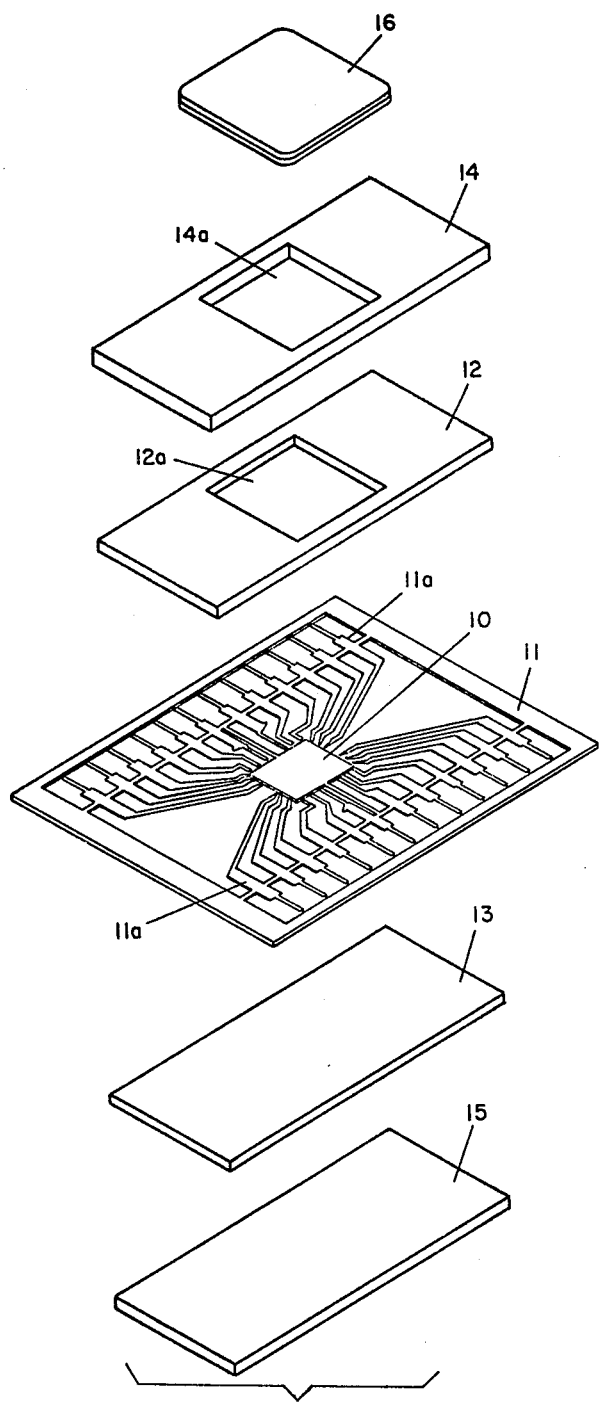
FIG. 1 is an exploded perspective view of an hermetically sealed container for semiconductor and other electronic devices embodying the invention.

Referring now to FIG. 1 of the drawings, there is shown in exploded perspective view an hermetically sealed container for electronic devices embodying the invention. This container comprises a supporting pad 10 for an electronic device and a conductive lead frame 11 of conventional construction surrounding the pad and forming therewith a unitary construction. Layers of thermosetting plastic material 12 and 13 extend over and are fused to either side of the lead frame 11 and its conductive leads. The layers 12 and 13 are preferably of homogeneous epoxy resin in sheet, paste, or liquid form, in the latter case being partially thermoset to adhere to the frame 11. The term homogeneous is used herein and in the appended claims in its usual sense to refer to a material uniform in composition and structure thruout its mass, as a solution or a crystal (CHEMICAL & ENGINEERING DICTIONARY, Chemical Publishing Company, Inc., New York, New York) to distinguish from materials consisting of a mixture of particles of two or more substances. The plastic layer 12 in sheet form has an aperture 12a dimensioned and disposed to surround the supporting pad 10 and a portion of the leads 11a of the lead frame 11. The container also includes upper and lower cover plates 14 and 15, respectively, of a material impervious to moisture and air fused to the plastic sheets 12 and 13, respectively. The cover plates are preferably of a material of the group comprising metal, ceramic, glass, and rigid plastic. The cover plate 14 adjacent the plastic sheet 12 has an aperture 14a in registry with the aperture 12a of the sheet 12 for receiving an electronic device to be supported on the pad 10.

Figure 3:
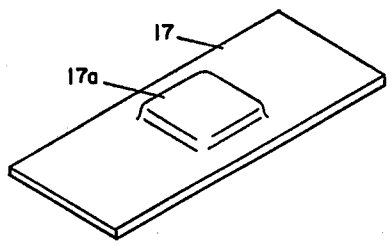
FIG. 3 is a perspective view of an alternative form of top cover plate of the unit of FIG. 1.
Figure 3A:
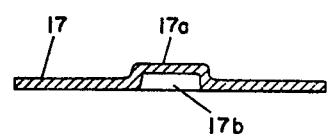

The container of the invention also includes means for hermetically sealing the opening 14a in cover plate 14. This may be a combined cover plate solder-preform unit 16, for example of the type described and claimed in U.S. Pat. No. 3,874,549, dated Apr. 1, 1975, and entitled "Hermetic Sealing Cover for a Container for a Semiconductor Device". Alternatively, the means for sealing the opening 14a of cover plate 14 may be as shown in FIGS. 3 and 3a in which the cover plate 14 of FIG. 1 is replaced by a cover 17 having an upset portion 17a forming a cavity 17b of sufficient height to accommodate any electronic device disposed on the supporting pad 10.

Figure 2:
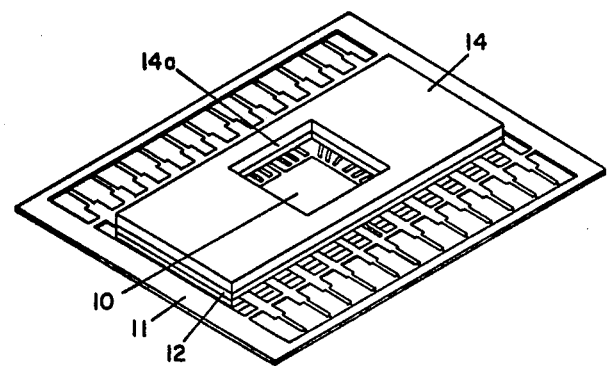
FIG. 2 is a perspective view of the container of FIG. 1 in assembled form.

The hermetically sealed container described with reference to FIG. 1 is shown in assembled form in FIG. 2, less the sealing cover 16, in which the corresponding elements are identified by the same reference numerals.

Figure 4:
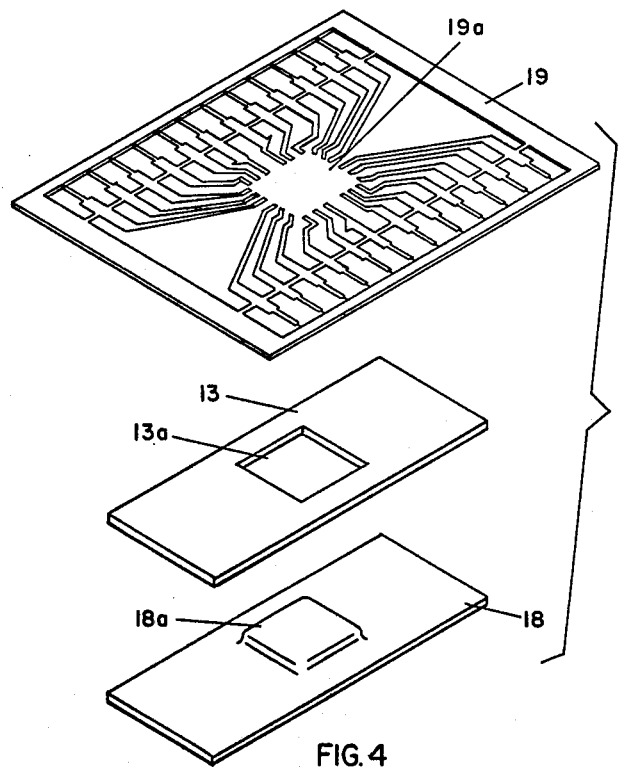
FIG. 4 is a partially exploded perspective view of an alternative form of the invention.

An alternative construction of a portion of the container is shown in FIG. 4 in which the lower cover plate 15 of FIG. 1 is replaced by a cover plate 18 having an upset portion or pedestal 18a forming a supporting pad for the electronic device. In this modification, the lead frame 11 is replaced by a lead frame 19 in which the supporting pad 10 is omitted. The plastic sheet 12 (not shown), as well as the plastic sheet 13, has an aperture dimensioned and disposed to surround the pedestal 18a of lower cover plate 18. The pedestal 18a is dimensioned to extend at least partially through the aperture of the adjacent plastic sheet 13 and preferably is of a dimension equal to the thickness of that sheet.

The hermetically sealed container of the type described above is relatively inexpensive but provides high-reliability hermetic seals with a minimum rejection rate of finished sealed electronic devices. It is of low cost relative to the ceramic base, lead frame, and sealing cover-solder preform unit of the type described in aforesaid U.S. Pat. No. 3,874,549. At the same time, it avoids the disadvantages of the plastic transfer-molded containers and various hybrids thereof.

While there have been described what are, at present, considered to be the preferred embodiments of the invention, it will be obvious to those skilled in the art that various changes and modifications may be made therein, without departing from the invention, and it is, therefore, aimed in the appended claims to cover all such changes and modifications as fall within the true spirit and scope of the invention.

What is claimed is:

1. An hermetically sealed container for electronic devices comprising:

a supporting pad for an electronic device;

a conductive lead frame surrounding said pad;

a sheet of homogeneous plastic material extending over and fused to each face of said frame and its conductive leads, at least one of said sheets having an aperture dimensioned and disposed to surround said supporting pad and a portion of the adjacent leads of said lead frame;

upper and lower cover plates of material impervious to moisture and air fused to said plastic sheets, one of said plates having an opening in registry with the aperture in the adjacent one of said plastic sheets for receiving an electronic device to be supported on said pad;

and means for hermetically sealing said opening in said one of said plates.

2. An hermetically sealed container in accordance with claim 1 in which said lead frame and supporting pad are of unitary construction.

3. An hermetically sealed container in accordance with claim 1 in which said sheets of plastic material are composed substantially of epoxy resin and said cover plates are of a material of the group comprising metal, ceramic, glass, and rigid plastic.

4. An hermetically sealed container in accordance with claim 1 in which the means for sealing the opening in said one of said plates is an upset cavity forming an integral portion thereof.

5. An hermetically sealed container in accordance with claim 1 in which said supporting pad is a portion of the lower cover plate and each of said plastic sheets has an aperture dimensioned and disposed to surround said supporting pad and a portion of the adjacent leads of said lead frame.

6. An hermetically sealed container in accordance with claim 5 in which the portion of the lower cover plate forming said supporting pad is in the form of a pedestal extending at least partially through the aperture of the adjacent one of said plastic sheets.

* * * * *